United States Patent
Salato et al.

(10) Patent No.: US 12,557,668 B2
(45) Date of Patent: Feb. 17, 2026

(54) HIGH VOLTAGE INTEGRATED CIRCUIT PACKAGES WITH DIAGONALIZED LEAD CONFIGURATION AND METHOD OF MAKING THE SAME

(71) Applicant: Allegro MicroSystems, LLC, Manchester, NH (US)

(72) Inventors: Maurizio Salato, Bedford, MA (US); William P. Taylor, Amherst, NH (US)

(73) Assignee: Allegro MicroSystems, LLC, Manchester, NH (US)

(*) Notice: Subject to any disclaimer, the term of this patent is extended or adjusted under 35 U.S.C. 154(b) by 382 days.

(21) Appl. No.: 18/307,921

(22) Filed: Apr. 27, 2023

(65) Prior Publication Data
US 2024/0363498 A1    Oct. 31, 2024

(51) Int. Cl.
*H01L 23/49* (2006.01)
*H01L 21/56* (2006.01)
*H01L 23/31* (2006.01)
*H01L 23/495* (2006.01)
*H01L 25/16* (2023.01)
*H10D 1/20* (2025.01)

(52) U.S. Cl.
CPC ........ *H01L 23/49541* (2013.01); *H01L 21/56* (2013.01); *H01L 23/3107* (2013.01); *H01L 25/16* (2013.01); *H10D 1/20* (2025.01)

(58) Field of Classification Search
CPC ........... H01L 23/49541; H01L 23/3107; H01L 21/56; H01L 25/16; H10D 1/20
USPC ........................................................ 257/666
See application file for complete search history.

(56) References Cited

U.S. PATENT DOCUMENTS

| | | | |
|---|---|---|---|
| 4,461,966 A | 7/1984 | Hebenstreit | |
| 4,748,351 A | 5/1988 | Barzegar | |
| 4,970,420 A | 11/1990 | Billings | |
| 5,019,719 A | 5/1991 | King | |
| 5,051,609 A | 9/1991 | Smith | |
| 5,430,613 A | 7/1995 | Hastings et al. | |

(Continued)

FOREIGN PATENT DOCUMENTS

| | | |
|---|---|---|
| DE | 3700488 A1 | 7/1988 |
| DE | 10 2004 033 125 A1 | 2/2006 |

(Continued)

OTHER PUBLICATIONS

Extended European Search Report dated Jul. 31, 2024 for European Application No. 24160646.6; 7 Pages.

(Continued)

*Primary Examiner* — Phuc T Dang
(74) *Attorney, Agent, or Firm* — DALY, CROWLEY, MOFFORD & DURKEE LLP

(57) ABSTRACT

Aspects of the present disclosure include systems, structures, circuits, and methods providing integrated circuit (IC) packages or modules having diagonalized leads. First and second semiconductor dies are disposed on a substrate. First and second coils are configured on the substrate for a transformer. The transformer may include a core. The leads or pins may be aligned along a diagonal of the package body, providing increased creepage. The IC packages and modules may include various types of circuits; in some examples, IC packages or modules may include a galvanically isolated gate driver or other high voltage circuit.

40 Claims, 5 Drawing Sheets

(56) References Cited

U.S. PATENT DOCUMENTS

| | | | |
|---|---|---|---|
| 5,598,135 A | 1/1997 | Maeda et al. | |
| 5,786,687 A * | 7/1998 | Faulk | H03K 17/04123 |
| | | | 323/289 |
| 5,847,631 A | 12/1998 | Taylor et al. | |
| 5,959,846 A | 9/1999 | Noguchi et al. | |
| 6,107,860 A | 8/2000 | Vinciarelli | |
| 6,181,130 B1 | 1/2001 | Hoshi et al. | |
| 6,281,560 B1 | 8/2001 | Allen et al. | |
| 6,377,155 B1 | 4/2002 | Allen et al. | |
| 6,775,901 B1 | 8/2004 | Lee et al. | |
| 6,791,851 B2 | 9/2004 | Brkovic | |
| 7,023,315 B2 | 4/2006 | Yeo et al. | |
| 7,119,448 B2 | 10/2006 | de Stasi | |
| 7,173,835 B1 | 2/2007 | Yang | |
| 7,663,351 B2 | 2/2010 | Korsunsky | |
| 7,719,112 B2 | 5/2010 | Shen | |
| 7,804,697 B2 | 9/2010 | Melanson | |
| 7,868,431 B2 | 1/2011 | Feng et al. | |
| 8,063,689 B2 | 11/2011 | Theiler | |
| 8,094,458 B2 | 1/2012 | Furnival | |
| 8,217,748 B2 | 7/2012 | Feng et al. | |
| 8,680,837 B2 | 3/2014 | Zeng et al. | |
| 8,736,343 B2 | 5/2014 | Chen et al. | |
| 8,816,666 B2 | 8/2014 | Kimura et al. | |
| 9,048,020 B2 | 6/2015 | Calvillo Cortes et al. | |
| 9,660,584 B2 | 5/2017 | Modi et al. | |
| 9,743,523 B2 | 8/2017 | Huang et al. | |
| 9,847,166 B2 | 12/2017 | Kneller | |
| 9,887,034 B2 | 2/2018 | Francis | |
| 9,899,140 B2 | 2/2018 | Kneller et al. | |
| 9,922,764 B2 | 3/2018 | Kneller et al. | |
| 9,948,294 B2 | 4/2018 | Peter et al. | |
| 9,958,482 B1 | 5/2018 | Latham | |
| 10,002,703 B2 | 6/2018 | Wang et al. | |
| 10,014,798 B1 | 7/2018 | Vinciarelli | |
| 10,062,495 B2 | 8/2018 | Lloyd | |
| 10,176,917 B2 | 1/2019 | Parish et al. | |
| 10,217,558 B2 | 2/2019 | Kneller | |
| 10,224,143 B2 | 3/2019 | Kneller et al. | |
| 10,229,779 B2 | 3/2019 | Harber | |
| 10,234,513 B2 | 3/2019 | Vig et al. | |
| 10,256,027 B2 | 4/2019 | Li et al. | |
| 10,319,509 B2 | 6/2019 | Kneller et al. | |
| 10,345,343 B2 | 7/2019 | Milano et al. | |
| 10,347,413 B2 | 7/2019 | Francis | |
| 10,352,969 B2 | 7/2019 | Milano et al. | |
| 10,573,457 B2 | 2/2020 | Wang et al. | |
| 10,753,963 B2 | 8/2020 | Milano et al. | |
| 10,811,181 B2 | 10/2020 | Parish et al. | |
| 10,930,422 B2 | 2/2021 | Francis | |
| 11,139,102 B2 | 10/2021 | Kneller et al. | |
| 11,150,273 B2 | 10/2021 | Liu et al. | |
| 11,183,436 B2 | 11/2021 | Liu et al. | |
| 11,201,619 B2 | 12/2021 | Rinne et al. | |
| 11,211,929 B2 | 12/2021 | Rinne et al. | |
| 11,262,385 B2 | 3/2022 | Milano et al. | |
| 11,282,631 B2 | 3/2022 | Francis | |
| 11,289,406 B2 | 3/2022 | Briano et al. | |
| 11,519,939 B2 | 12/2022 | Liu et al. | |
| 11,519,946 B1 | 12/2022 | Rock et al. | |
| 11,791,170 B2 * | 10/2023 | Bin Abdul Aziz | H01L 23/49537 |
| | | | 257/787 |
| 2006/0152911 A1 | 7/2006 | Humbert et al. | |
| 2006/0237830 A1 * | 10/2006 | Danno | H01L 23/3107 |
| | | | 257/E23.079 |
| 2009/0147544 A1 | 6/2009 | Melanson | |
| 2009/0237899 A1 | 9/2009 | Furnival | |
| 2012/0008344 A1 | 1/2012 | Zeng et al. | |
| 2012/0020419 A1 | 1/2012 | Kaeriyama | |
| 2012/0206171 A1 | 8/2012 | Kimura et al. | |
| 2012/0238056 A1 * | 9/2012 | Numazaki | H01L 24/49 |
| | | | 438/107 |
| 2013/0293268 A1 | 11/2013 | Draxelmayr et al. | |
| 2015/0004902 A1 * | 1/2015 | Pigott | H04B 5/72 |
| | | | 455/41.1 |
| 2015/0171934 A1 * | 6/2015 | Brauchler | H01L 21/4857 |
| | | | 455/41.1 |
| 2016/0181004 A1 | 6/2016 | Li et al. | |
| 2018/0090472 A1 * | 3/2018 | Disney | H01L 25/18 |
| 2019/0259690 A1 | 8/2019 | Kawashima | |
| 2020/0098671 A1 * | 3/2020 | Zhou | H01L 23/49562 |
| 2020/0343166 A1 | 10/2020 | Bonifacio et al. | |
| 2020/0388570 A1 * | 12/2020 | Johnson | H01F 17/0013 |
| 2021/0376822 A1 | 12/2021 | Thompson et al. | |
| 2022/0116036 A1 | 4/2022 | Rinne et al. | |
| 2022/0137097 A1 | 5/2022 | Milano et al. | |
| 2022/0165647 A1 | 5/2022 | Briano et al. | |
| 2023/0058695 A1 | 2/2023 | Boden et al. | |
| 2023/0060219 A1 | 3/2023 | Liu et al. | |

FOREIGN PATENT DOCUMENTS

| | | | | |
|---|---|---|---|---|
| EP | 2819160 A1 * | 12/2014 | | H04B 5/263 |
| EP | 2320458 B1 * | 12/2015 | | H01L 25/18 |
| GB | 2 250 383 A | 6/1992 | | |
| GB | 2 341 288 A | 3/2000 | | |
| JP | H01300617 A | 12/1989 | | |
| JP | 2001 167941 A | 6/2001 | | |
| JP | 2003 234234 A | 8/2003 | | |
| JP | 2008 072021 A | 3/2008 | | |
| WO | WO 93/21690 | 10/1993 | | |
| WO | WO 95/12247 | 5/1995 | | |
| WO | WO 2009/008739 A1 | 1/2009 | | |
| WO | WO 2010/061281 A2 | 6/2010 | | |
| WO | WO 2011/137845 A1 | 11/2011 | | |
| WO | WO-2021085216 A1 * | 5/2021 | | H01L 21/4882 |
| WO | WO 2021/211920 A1 | 10/2021 | | |

OTHER PUBLICATIONS

U.S. Appl. No. 17/817,796, filed Aug. 5, 2022, Briano et al.
U.S. Appl. No. 18/182,434, filed Mar. 13, 2023, Liu.
Bourgeois, "An Isolated Gate 25 Drive For Power MOSFETs and IGBTs", STMicroelectronics Group, AN461/0194, 1999; 7 pages.
"ADuM4135 Data Sheet, Single-/Dual-Supply, High Voltage Isolated IGBT Gate Driver with Miller Clamp", Analog Devices Inc., Rev. E, 2015; 17 pages.
"Si827x", Datasheet Rev. 0.5, Silicon Laboratories Inc., 2016; 43 pages.

* cited by examiner

500 ⤦

┌─────────────────────────────────────────────────────────────┐
│ Providing a substrate configured to receive at least one semiconductor │
│ die and including a plurality of leads, wherein the plurality of leads │
│ includes a first lead set and a second lead set for connection to the at │
│ least one semiconductor die │
│ 502 │
└─────────────────────────────────────────────────────────────┘
                                  ↓
┌─────────────────────────────────────────────────────────────┐
│ Configuring the first and second lead sets on opposing sides of a │
│ longitudinal axis and at opposing ends, e.g., on a major diagonal, │
│ of an area for rectangular package body │
│ 504 │
└─────────────────────────────────────────────────────────────┘
                                  ↓
┌─────────────────────────────────────────────────────────────┐
│ Providing a transformer including first and second coils in the package │
│ body; the transformer optionally including a transformer core │
│ 506 │
└─────────────────────────────────────────────────────────────┘
                                  ↓
┌─────────────────────────────────────────────────────────────┐
│ Molding a molding material to form a package body covering a portion │
│ of the substrate, wherein the package body has a length (L), a width (W), │
│ and a height (H), and wherein the package body has a longitudinal │
│ axis dividing the body along the width (W) │
│ 508 │
└─────────────────────────────────────────────────────────────┘
                                  ↓
┌─────────────────────────────────────────────────────────────┐
│ Wherein the at least one semiconductor die comprises first and second │
│ semiconductor dies, and wherein the first and second coils are │
│ connected to the first and second semiconductor dies, respectively, │
│ providing galvanic isolation │
│ 510 │
└─────────────────────────────────────────────────────────────┘

*FIG. 5*

HIGH VOLTAGE INTEGRATED CIRCUIT PACKAGES WITH DIAGONALIZED LEAD CONFIGURATION AND METHOD OF MAKING THE SAME

BACKGROUND

Voltage isolation can be used for electronic packages having circuit components with two separate voltage levels connected to the electrical connections of the package. Galvanic isolation typically includes electrical isolation coupled with lack of direct electrical contact between the circuit components. Galvanic isolation can be used to prevent undesirable DC currents flowing from one side of an isolation barrier to the other. Such galvanic isolation can be used to separate circuits in order to protect users from coming into direct contact with hazardous voltages. Galvanic isolation may also be used to simplify circuit design, reduce cost or improve system performance.

For solid state switches utilizing galvanic isolation, the control circuit with switch driver inputs typically reside on one side of the galvanic isolation barrier, while the switch driven by the switch driver typically resides on the other side of the isolation barrier. Various transmission techniques are available for signals to be sent across galvanic isolation barriers including optical, capacitive, and magnetic coupling techniques. Magnetic coupling typically relies on use of a transformer to couple, yet galvanically separate, circuits on the different sides of the transformer, typically referred to as the primary and secondary sides.

Integrated circuit (IC) packages used for isolated voltage circuits like ones utilizing magnetic coupling can have problems meeting certain voltage isolation requirements, such as creepage and/or clearance requirements specified for different pollution degree categories. The problems can become pronounced as feature size(s) for an IC package are reduced.

FIG. 1A is a side view showing a prior art integrated circuit (IC) package 100 with a main body 101 having conventional lead locations 102a-b, 103a-b. FIG. 1B is a bottom view of the prior art IC package of FIG. 1A. As shown in FIG. 1B, IC package 100 has a certain minimum creepage (indicated) for a given size, where creepage can be defined as the minimum distance between two conductors along an insulative (insulating surface) between the two conductors.

SUMMARY

One general aspect of the present disclosure includes a voltage isolated (a.k.a., galvanically isolated) integrated circuit (IC) package. The voltage isolated integrated circuit can include: a substrate configured to receive one or more (e.g., first and second) semiconductor dies and including a plurality of leads, where the plurality of leads includes a first lead (e.g., pin or pad or other accessible conductive structure) set and a second lead (e.g., pin or pad) set for the first and second semiconductor dies, respectively; a molding material configured to cover a portion of the substrate and form a rectangular package body having a length (L), a width (W), and a height (H), where the body has a longitudinal axis dividing the body along the width (W); and first and second coils configured as a transformer and disposed in the package body, each coil including a plurality of windings connected to the first and second semiconductor dies, respectively; where the first and second lead sets protrude from the package body; and where the first and second lead sets are disposed at on opposing sides of the longitudinal axis and at opposing ends of the rectangular package body.

Implementations may include one or more of the following features. The transformer of the IC package may further include a core. The first and second lead sets can be disposed at lead locations at opposite ends of a diagonal of the rectangular body, respectively. The first or second semiconductor die may include at least one integrated circuit. The at least one integrated circuit may include a gate driver circuit. The gate driver and transformer may include an isolated gate driver. The width (W) may include four equal-width quarters including two middle quarters and two outer quarters on either side of the two middle quarters, where the first and second lead sets can be disposed in one of the outer quarters, respectively. The IC package may include an insulator (dielectric) material disposed between the first and second coils. The width (W) may include three equal-width thirds including a middle third and two outer thirds on either side of the middle third, where the first and second lead sets are disposed in one of the outer thirds, respectively. Each of the first and second lead sets includes a lead protruding from the rectangular body along one side and one end of the rectangular body. The first and second lead sets are disposed at distal regions on opposite sides of the longitudinal axis, respectively. The first and second lead sets are disposed at lead locations at opposite ends of a diagonal of the rectangular body, respectively. The first and second lead sets extend from the rectangular body. The substrate may include a printed circuit board (PCB). The substrate may include a flexible substrate, e.g., a polyimide substrate. The substrate may include a low temperature co-fired ceramic (LTCC) or a high temperature co-fired ceramic (HTCC). The substrate may include an alumina substrate may include thin film layers. The substrate may include a glass substrate may include thin film layers. The substrate may include a lead frame. The lead frame may include a molded lead frame. Implementations of the described techniques may include hardware, a method or process, or computer software on a computer-accessible medium.

One general aspect of the present disclosure includes an integrated circuit (IC) chip package. The integrated circuit package can include: a lead frame configured to receive at least one semiconductor die and including a plurality of leads, where the plurality of leads includes a first lead set and a second lead set for the first and second semiconductor dies, respectively; and a molding material configured to cover a portion of the lead frame and form a rectangular package body having a length (L), a width (W), and a height (H), where the body has a longitudinal axis dividing the body along the width (W); where the first and second lead sets include exposed portions on the package body; and where the first lead set and the second lead set are disposed at on opposing sides of the longitudinal axis and at opposing ends of the rectangular package body.

Implementations may include one or more of the following features. For the IC chip package, the width (W) may include three equal-width thirds including a middle third and two outer thirds on either side of the middle third, where the first and second lead sets are disposed in one of the outer thirds, respectively. The width (W) may include four equal-width quarters including two middle quarters and two outer quarters on either side of the two middle quarters, where the first and second lead sets are disposed in one of the outer quarters, respectively. Each of the first and second lead sets can include a portion (e.g., portion of a lead) protruding/extending from the rectangular body along one side and one end of the rectangular body. The first and second lead sets can be disposed at distal regions on opposite sides of the longitudinal axis, respectively. The IC chip package may include first and second coils disposed in the package body and configured as a transformer. The at least one semiconductor die (a.k.a., IC die) may include first and second semiconductor dies, and where the first and second coils are connected to the first and second semiconductor dies, respectively. The transformer further may include a transformer core.

One general aspect includes a method of making a high-voltage integrated circuit (IC) package. The method can include providing a substrate configured to receive at least one semiconductor die and including a plurality of leads, where the plurality of leads includes a first lead set and a second lead set for connection to the at least one semiconductor die; molding a molding material to form a package body covering a portion of the substrate, where the package body has a length (L), a width (W), and a height (H), and where the package body has a longitudinal axis dividing the body along the width (W); and configuring the first lead set and second lead set on opposing sides of the longitudinal axis and at opposing ends of the package body.

Implementations may include one or more of the following features. The method may include providing first and second coils in the package body and configured as a transformer. At least one semiconductor die may include first and second semiconductor dies, and where the first and second coils are connected to the first and second semiconductor dies, respectively. The first and second semiconductor dies may include first and second integrated circuits, and where the first and second integrated circuits are galvanically isolated. The first and/or second integrated circuit may include a gate driver. The width (W) may include three equal-width thirds including a middle third and two outer thirds on either side of the middle third, where the first and second lead sets are disposed in one of the outer thirds, respectively. The width (W) may include four equal-width quarters including two middle quarters and two outer quarters on either side of the two middle quarters, where the first and second lead sets are disposed in one of the outer quarters, respectively. The first and second lead set are disposed at distal regions on opposite sides of the longitudinal axis, respectively. The first and second lead sets include portions that extend from the rectangular body.

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the present disclosure, which is susceptible of many embodiments. What follows is illustrative, but not exhaustive, of the scope of the present disclosure.

BRIEF DESCRIPTION OF THE DRAWINGS

The manner and process of making and using the disclosed embodiments may be appreciated by reference to the figures of the accompanying drawings. In the figures like reference characters refer to like components, parts, elements, or steps/actions; however, similar components, parts, elements, and steps/actions may be referenced by different reference characters in different figures. It should be appreciated that the components and structures illustrated in the figures are not necessarily to scale, emphasis instead being placed upon illustrating the principals of the concepts described herein. Furthermore, embodiments are illustrated by way of example and not limitation in the figures, in which:

FIG. 5 is a block diagram showing an example method of fabricating an IC package with a diagonalized lead configuration, in accordance with the present disclosure.

DETAILED DESCRIPTION

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the inventive subject matter. The subject technology is susceptible of many embodiments. What follows is illustrative, but not exhaustive, of the scope of the subject technology.

Aspects of the present disclosure are directed to and include systems, structures, circuits, and methods providing integrated circuit (IC) packages or modules having diagonalized lead configurations. The IC packages and modules may include various types of circuits; in some examples, IC packages or modules may include a galvanically isolated gate driver or other high voltage circuit, etc. ICs included in a package can include, but are not limited to, high-voltage circuits such as galvanically-isolated gate drivers configured to drive an external gate on a MOSFET or the like, or another load.

Figure 2A:
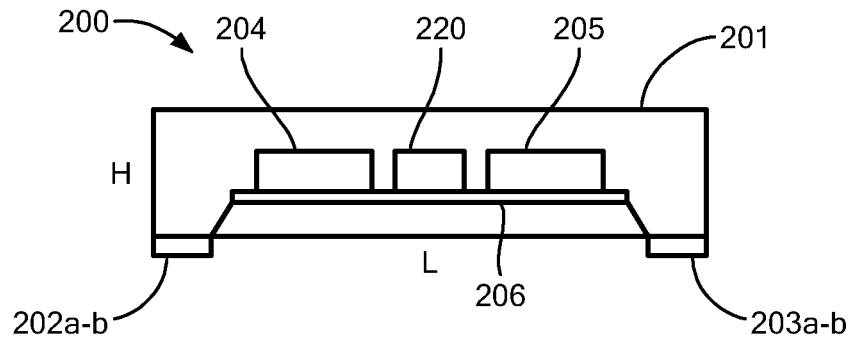
FIG. 2A is a side view of an example IC package having a diagonalized lead configuration, in accordance with the present disclosure.
Figure 2B:
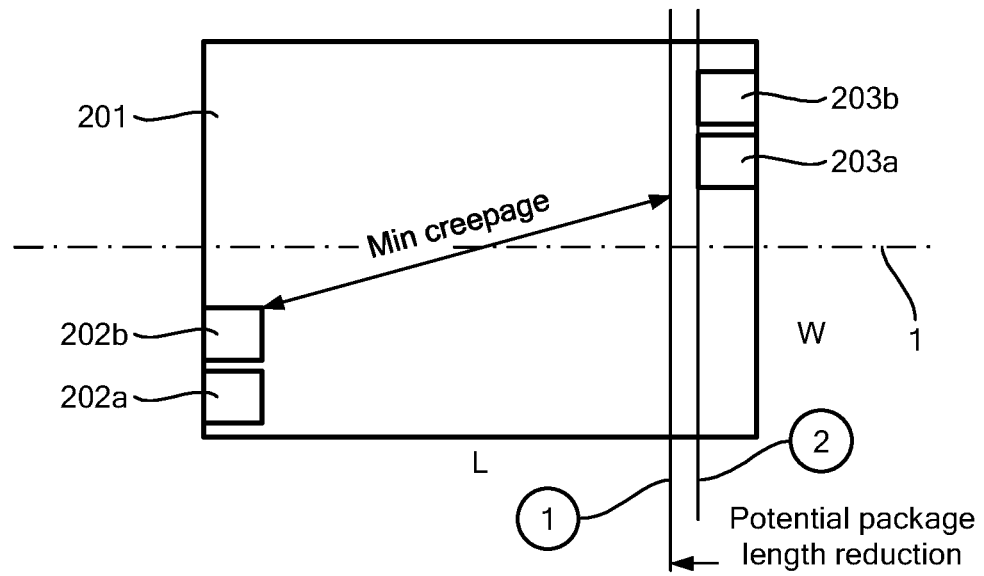
FIG. 2B is a top view of the IC package of FIG. 2A.

FIG. 2A is a side view of an example IC package 200 having a diagonalized lead configuration, in accordance with the present disclosure. FIG. 2B is a bottom view of the IC package of FIG. 2A. As shown, IC package 200 can include a package body 201. Package body 201 may include one or more semiconductor die, a.k.a., integrated circuit die (die in the singular; die, dies, or dice in the plural). For example, first and second integrated circuit (IC) dies 204, 205 disposed are shown disposed on a substrate 206. Transformer 220 can provide magnetic coupling of die (a.k.a., dies or dice) 204, 205 while providing galvanic separation, also known as voltage isolation. Substrate 206 is configured to receive semiconductor dies 202, 203. Substrate 206 may include or be composed of any suitable electrical substrate, including, but not limited to, a lead frame, a printed circuit board (PCB), an alumina substrate, a ceramic substrate, e.g., high temperature co-fired ceramic (HTCC) or low-temperature co-fired ceramic (LTCC), a flexible substrate, e.g., polyimide with conductive traces, a glass substrate, e.g., with multiple thin glass layers, or the like. Package 200 includes first and second sets of leads (e.g., lead pairs) 202a-b and 203a-b that are connected to first and second IC dies 204, 205, respectively. First and second sets of leads 202a-b and 203a-b allow for connecting the first and/or second dies to systems, circuits, and/or components outside of package 200. In some embodiments and examples, die 204, 205 and a transformer (not shown) may be placed on substrate 206 (e.g., a lead frame or a pre-molded lead frame). In some embodiments and examples, die 204, 205 can be placed on a first substrate, e.g., a lead frame or a pre-molded lead frame, and other package components, e.g., a transformer electrically connected to the die 204. 205, may be placed on another substrate, e.g., a PCB, in package 200.

Figure 1A:
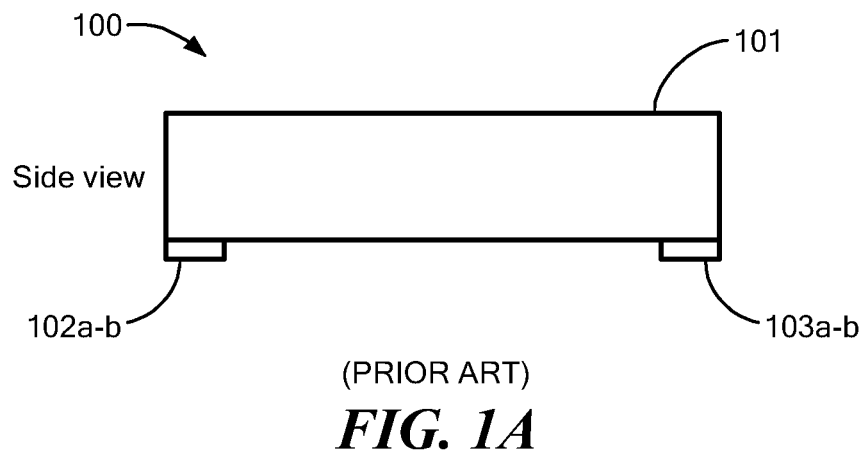
FIG. 1A is a side view showing a prior art integrated circuit (IC) package with a main body having conventional lead locations.
Figure 1B:
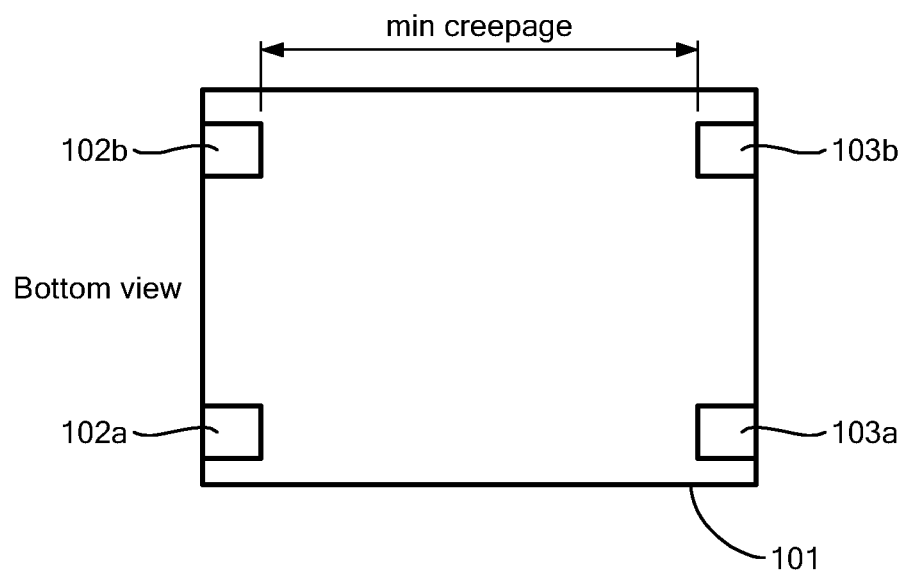
FIG. 1B is a top view of the prior art IC package of FIG. 1A.

As shown in FIG. 2B, for a package size essentially the same as shown for prior art IC package 100 in FIG. 1B, package 200 affords a greater minimum creepage (shown). Alternatively, to obtain the same minimum creepage shown for package 100, package 200 can be sized with a smaller footprint, e.g., with a smaller length dimension as shown. For example, the length of the package may be reduced, as shown by circled position 1 relative to circled position 2, which reduces the total package size. In some instances, the total package size reduction can lower costs by allowing more packages to be molded or formed during a mold process as more package mold cavities can fit in the mold machine.

As noted, in some examples and embodiments, substrate 206 can include, but is not limited to, a flexible circuit (e.g., polyimide with conductive traces), a printed circuit board (PCB), a low temperature cofired ceramic (LTCC), an alumina substrate comprising thin film layers, a glass substrate comprising thin film layers, or a high temperature ceramic (HTCC), or the like. Dies 204, 205 may include integrated circuits (ICs), e.g., data and/or power transmission and/or reception circuits for sending data and/or power across (traversing) the galvanic isolation barrier provided by coil 220. In some examples and embodiments, coil 220 can include a core, e.g., a soft ferromagnetic core (not shown).

In some examples and embodiments, the first and second dies 204, 205 (e.g., which may be on primary side and secondary sides of transformer 220) in the main body 210 can be fabricated or configured to have a desired minimum separation distance, e.g., to meet creepage, voltage breakdown, and/or clearance requirements for a given pollution degree as defined by certain safety standards bodies such as the UL (Underwriters Laboratories), DIN (Deutsches Institut für Normung), ISO (International Organization for Standardization), VDA (Verband der Automobilindustrie) and/or the IEC (International Electrotechnical Commission), among others. For example, package 200 can have a desired separation distance between closest (voltage) points of the respective circuits, e.g., the low (primary) side and high (secondary) side on either side of transformer 220 (including its primary and secondary coils). For example, the distance between any two voltage points between the primary and secondary sides, e.g., between die 204 and die 205 in FIG. 2A, may be at least 1.2 mm, 1.4 mm, 1.5 mm, 3.0 mm, 4.0 mm, 5.5 mm, 8.0 mm, 10 mm, or 10+ mm, in respective examples. Such a distance between conductive portions of dies or other circuit portions/structure(s) can include any insulation covering a conductor, e.g., such as plastic coating of a wire/lead.

Figure 3:
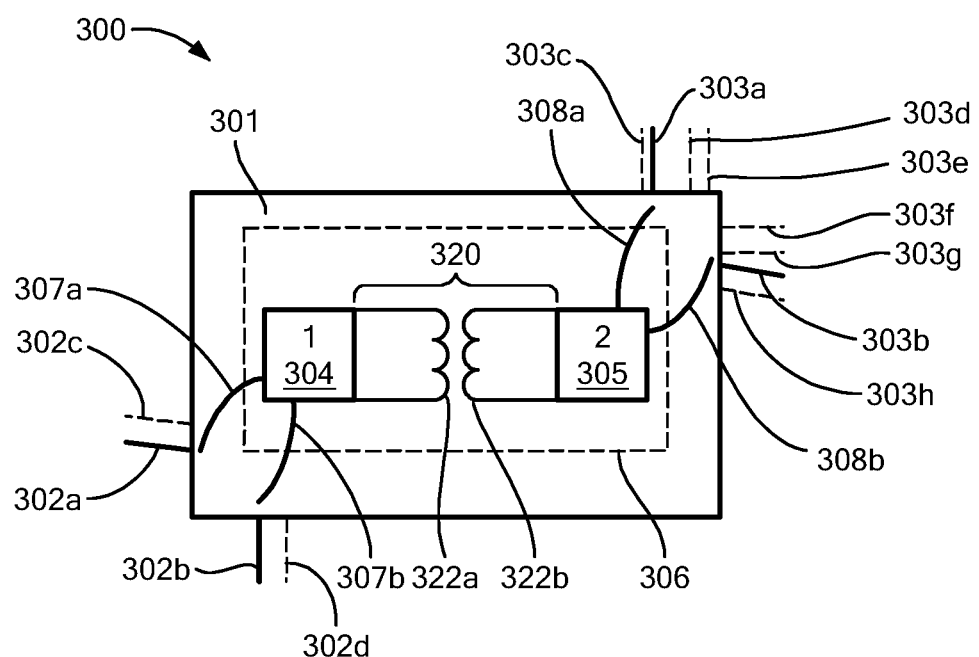
FIG. 3 is a top view of another example IC package with diagonalized lead configurations, in accordance with the present disclosure.

FIG. 3 is a top view of another example IC package 300 with diagonalized lead configurations, in accordance with the present disclosure. Package 300 includes package body 301 with first and second sets of leads (e.g., pins) 302a-b and 303a-b. As shown by additional leads (pins) 302c-d and 303c-h, a lead (e.g., pin) set may include more than two leads (pins) and, as shown, one lead set may have a different number of leads relative to the other lead set. Package body 301 includes first and second IC dies 304, 305 disposed on (received/supported by) substrate 306. Package 300 can include transformer 320 having first and second coils 322a, 322b. Electrical connections (e.g., conductive traces) 307a-b can connect first die 304 to first lead set 302a-b. Electrical connections 308a-b can connect second die 305 to second lead set 303a-b. The electrical connections between the die 304, 305 and lead sets (groupings) may be made with wire bonds, or flip-chip attached with electrically conductive bumps or pillars to the lead frame or other type of electrical substrate. In some examples and embodiments, transformer 320 can include a core (not shown), e.g., a soft ferromagnetic core. As shown, leads of first lead set 302a-b can be splayed or at right angles (orthogonal) to one another, with one lead emanating from one side of body 301 while the other lead emanates from another side of boy 301. Similarly, leads of second lead set 303a-b can be splayed or at right angles (orthogonal) to one another, with one lead emanating from one side of body 301 while the other lead emanates from another side of boy 301. Although lead sets 302a-d are shown with four leads, other numbers of leads are possible, e.g., four, six, eight leads per diagonal position, or more leads as needed.

Figure 4A:
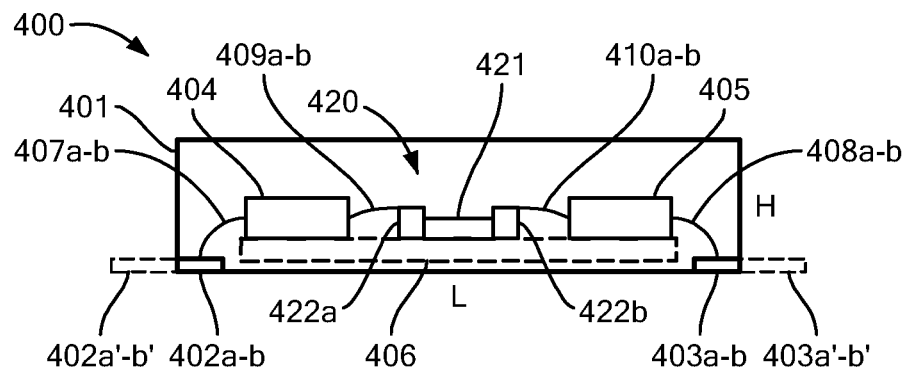
FIG. 4A is a diagram showing a side view of a further example IC package having a diagonalized lead configuration, in accordance with the present disclosure.
Figure 4B:
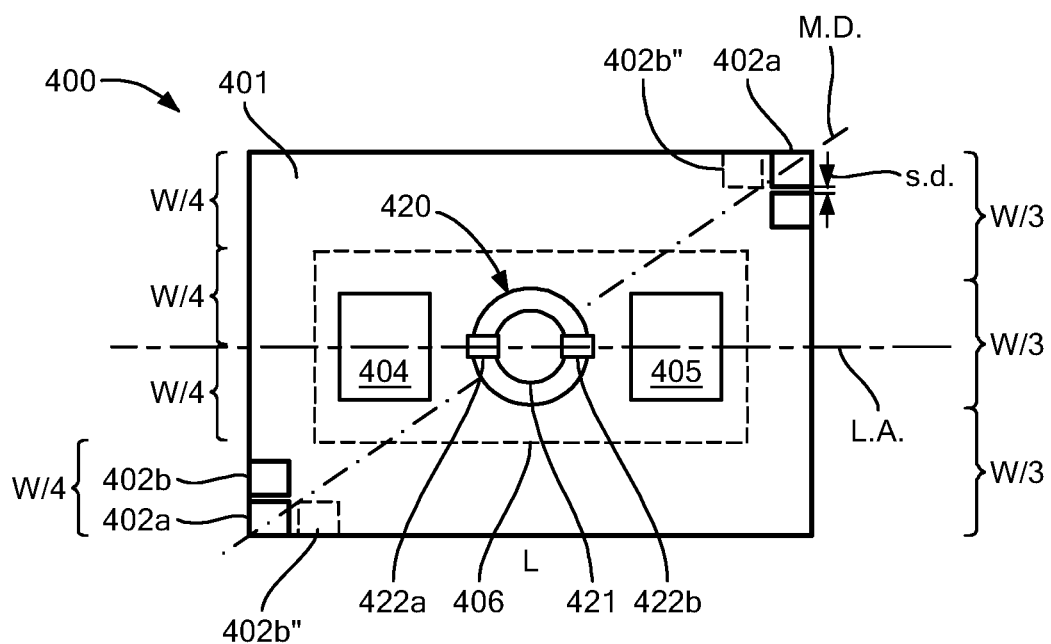
FIG. 4B is a bottom view of the IC package of FIG. 4A.

FIG. 4A is a diagram showing a side view of a further example IC package 400 having a diagonalized lead configuration, in accordance with the present disclosure. FIG. 4B is a bottom view of IC package 400 of FIG. 4A. Package 400 includes package body 401 with representative length (L), height (H), and width (W) shown.

Package body 401 with lead pairs (conductive pads) 402a-b and 403a-b. Alternate extended lead pair configurations 402a'-b' and 403a'-b' are shown. Package 400 can include substrate 406 receiving (supporting) first and second IC dies (dice) 404, 405. First and second IC dies 404, 405 can be connected to lead pairs 402a-b and 403a-b by conductive elements 407a-b and 408a-b (e.g., wire bonds), respectively. Package 400 can include transformer 420 having first and second coils 422a-b, e.g., disposed on substrate 406. First and second coils 422a-b can be connected to first and second dies 404, 405, e.g., by conductive elements (wire bonds) 409a-b and 410a-b, respectively. In some examples and embodiments, transformer 420 can include a core 421, e.g., including soft ferromagnetic material such as ferrite or the like, or an air core.

FIG. 4B shows a longitudinal axis (L.A.) and one major diagonal (M.D.) of package body 401. Lead sets (e.g., lead or pin pairs) 402a-b and 403a-b can be configured along (aligned with) the major diagonal (M.D.). For example, lead pairs 402a-b and 403a can be aligned along the M.D. on opposing sides of the longitudinal axis (L.A.) and at opposing ends of the rectangular package body 401, as shown. In some examples and embodiments, body 401 is not necessarily rectangular and may have any desired suitable shape. In some embodiments, a lead pair, e.g., 402a-b, may be disposed or configured within, e.g., an outermost ⅓ or ¼ of a dimension of the package body, e.g., width (W), etc. For example, lead pair 402a-b may be configured within W/4 of the width of body 401, distal to the L.A. Similarly, lead pair 403a-b is shown configured within W/4 of the width of body 401, distal to the L.A., at the opposite end of body 401. Other configuration of lead sets (lead pairs) 402a-b, 403a-b, may of course be implemented within the scope of the present disclosure. Alternate or additional lead (e.g., pin, pad) locations 402b" and 403b" are also shown. As noted previously, while lead sets 402*a-b* and 403*a-b* are shown with two leads/pins/pads each, other embodiments and examples can include different numbers (even or odd) of leads/pins/pads at each diagonalized location, e.g., four, five, six, etc.

FIG. 5 is a diagram showing method 500 of fabricating an IC package configured with diagonalized leads, in accordance with the present disclosure. Method 500 can include providing a substrate configured to receive at least one semiconductor die and including a plurality of leads, wherein the plurality of leads includes a first lead grouping or set (e.g., pad or pin pair) and a second lead grouping or set (e.g., pin pair) for connection to the at least one semiconductor die, as described at 502. The first and second lead sets (e.g., first and second pad or pin pairs) can be configured or positioned at locations that are on opposing sides of a longitudinal axis and at opposing ends, e.g., on a major diagonal, of an area used for a rectangular package body, as described at 504. A transformer including first and second coils may be provided or placed at a position within an area used for the package body, as described at 506. The transformer can optionally include a suitable transformer core, e.g., of soft ferromagnetic material or an air core, etc.; the first and second coils may be configured about (extend around) a portion of the core.

A molding material can be molded to form a package body covering a portion of the substrate, as described at 508. The package body can have a length (L), a width (W), and a height (H). The package body can have a longitudinal axis dividing the body along the width (W). The package body can also have a major diagonal (M.D.). The at least one semiconductor die can include first and second semiconductor dies, and wherein the first and second coils can be connected to the first and second semiconductor dies, respectively, providing galvanic isolation, as described at 510.

Accordingly, embodiments of the inventive subject matter can afford various benefits relative to prior art techniques. Embodiments and examples of the present disclosure can enable or facilitate meeting certain voltage isolation requirements, such as internal creepage, voltage breakdown, and/or external clearance requirements, e.g., as specified for different pollution degree ratings.

Various embodiments of the concepts, systems, devices, structures, and techniques sought to be protected are described above with reference to the related drawings. Alternative embodiments can be devised without departing from the scope of the concepts, systems, devices, structures, and techniques described.

It is noted that various connections and positional relationships (e.g., over, below, adjacent, etc.) may be used to describe elements and components in the description and drawings. These connections and/or positional relationships, unless specified otherwise, can be direct or indirect, and the described concepts, systems, devices, structures, and techniques are not intended to be limiting in this respect. Accordingly, a coupling of entities can refer to either a direct or an indirect coupling, and a positional relationship between entities can be a direct or indirect positional relationship.

As an example of an indirect positional relationship, positioning element "A" over element "B" can include situations in which one or more intermediate elements (e.g., element "C") is between elements "A" and elements "B" as long as the relevant characteristics and functionalities of elements "A" and "B" are not substantially changed by the intermediate element(s).

Also, the following definitions and abbreviations are to be used for the interpretation of the claims and the specification. The terms "comprise," "comprises," "comprising," "include," "includes," "including," "has," "having," "contains" or "containing," or any other variation are intended to cover a non-exclusive inclusion. For example, an apparatus, a method, a composition, a mixture, or an article, that includes a list of elements is not necessarily limited to only those elements but can include other elements not expressly listed or inherent to such apparatus, method, composition, mixture, or article.

Additionally, the term "exemplary" means "serving as an example, instance, or illustration. Any embodiment or design described as "exemplary" is not necessarily to be construed as preferred or advantageous over other embodiments or designs. The terms "one or more" and "at least one" indicate any integer number greater than or equal to one, i.e., one, two, three, four, etc. The term "plurality" indicates any integer number greater than one. The term "connection" can include an indirect "connection" and a direct "connection".

References in the specification to "embodiments," "one embodiment," "an embodiment," "an example embodiment," "an example," "an instance," "an aspect," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it may affect such feature, structure, or characteristic in other embodiments whether explicitly described or not.

Relative or positional terms including, but not limited to, the terms "upper," "lower," "right," "left," "vertical," "horizontal, "top," "bottom," and derivatives of those terms relate to the described structures and methods as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another, or a temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target (or nominal) value in some embodiments, within plus or minus (±) 10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

The disclosed subject matter is not limited in its application to the details of construction and to the arrangements of the components set forth in the following description or illustrated in the drawings. The disclosed subject matter is capable of other embodiments and of being practiced and carried out in various ways.

Also, the phraseology and terminology used in this patent are for the purpose of description and should not be regarded as limiting. As such, the conception upon which this disclosure is based may readily be utilized as a basis for the designing of other structures, methods, and systems for carrying out the several purposes of the disclosed subject matter. Therefore, the claims should be regarded as including such equivalent constructions as far as they do not depart from the spirit and scope of the disclosed subject matter.

Although the disclosed subject matter has been described and illustrated in the foregoing exemplary embodiments, the present disclosure has been made only by way of example. Thus, numerous changes in the details of implementation of the disclosed subject matter may be made without departing from the spirit and scope of the disclosed subject matter.

Accordingly, the scope of this patent should not be limited to the described implementations but rather should be limited only by the spirit and scope of the following claims.

All publications and references cited in this patent are expressly incorporated by reference in their entirety.

What is claimed is:

1. A voltage isolated integrated circuit (IC) package comprising:
   a substrate configured to receive first and second semiconductor dies and including a plurality of leads, wherein the plurality of leads includes a first lead set and a second lead set for the first and second semiconductor dies, respectively;
   a molding material configured to cover a portion of the substrate and form a rectangular package body having a length (L), a width (W), and a height (H), wherein the rectangular package body has a longitudinal axis dividing the body along the width (W); and
   first and second coils configured as a transformer and disposed in the rectangular package body, each coil including a plurality of windings connected to the first and second semiconductor dies, respectively;
   wherein the first and second lead sets protrude from the package body;
   wherein the first and second lead sets are disposed on opposing sides of the longitudinal axis and at opposing ends of the rectangular package body, and
   wherein a diagonal line of minimal distance extending from any point on the first lead set to any point on the second lead set is greater than the length L for maximizing the creepage distance of the IC package.

2. The IC package of claim 1, wherein the transformer further comprises a core.

3. The IC package of claim 1, wherein the first or second semiconductor die comprises at least one integrated circuit.

4. The IC package of claim 3, wherein the at least one integrated circuit comprises a gate driver circuit.

5. The IC package of claim 1, further comprising an insulator material disposed between the first and second coils.

6. The IC package of claim 4, wherein the gate driver circuit and transformer comprise an isolated gate driver.

7. The IC package of claim 6, wherein the width (W) comprises four equal-width quarters including two middle quarters and two outer quarters on either side of the two middle quarters, wherein the first and second lead sets are disposed in one of the outer quarters, respectively.

8. The IC package of claim 1, wherein each of the first and second lead sets includes a lead protruding from the rectangular package body along one side and one end of the rectangular body.

9. The IC package of claim 1, wherein the first and second lead sets are disposed at distal regions on opposite sides of the longitudinal axis, respectively.

10. The IC package of claim 1, wherein the first and second lead sets are disposed at lead locations at opposite ends of a diagonal of the rectangular package body, respectively.

11. The IC package of claim 1, wherein the first and second lead sets extend from the rectangular package body.

12. The IC package of claim 1, wherein the substrate comprises a printed circuit board (PCB).

13. The IC package of claim 1, wherein the substrate comprises a flexible substrate.

14. The IC package of claim 1, wherein the substrate comprises a low temperature cofired ceramic (LTCC) or a high temperature cofired ceramic (HTCC).

15. The IC package of claim 1, wherein the substrate comprises an alumina substrate comprising thin film layers.

16. The IC package of claim 1, wherein the substrate comprises a glass substrate comprising thin film layers.

17. The IC package of claim 1, wherein the substrate comprises a lead frame.

18. The IC package of claim 17, wherein the lead frame comprises a molded lead frame.

19. The IC package of claim 1, wherein the rectangular IC package has leads on only two opposite sides.

20. The IC package according to claim 1, wherein the IC lead package comprises, in order, a first side, a second side, a third side, and a fourth side, wherein leads of the first lead set are disposed on the first and second sides, which form a first corner of the IC package, and leads of the second lead set are disposed on the third and fourth side, which form a second corner diagonally opposite the first corner.

21. A voltage isolated integrated circuit (IC) package comprising:
   a substrate configured to receive first and second semiconductor dies and including a plurality of leads, wherein the plurality of leads includes a first lead set and a second lead set for the first and second semiconductor dies, respectively;
   a molding material configured to cover a portion of the substrate and form a rectangular package body having a length (L), a width (W), and a height (H), wherein the body has a longitudinal axis dividing the body along the width (W); and
   first and second coils configured as a transformer and disposed in the rectangular package body, each coil including a plurality of windings connected to the first and second semiconductor dies, respectively;
   wherein the first and second lead sets protrude from the rectangular package body;

wherein the first and second lead sets are disposed at on opposing sides of the longitudinal axis and at opposing ends of the rectangular package body; and wherein the width (W) comprises three equal-width thirds including a middle third and two outer thirds on either side of the middle third, wherein the first and second lead sets are disposed in one of the outer thirds, respectively.

22. The IC package according to claim 21, wherein the length (L) comprises three equal thirds including a middle third and two outer thirds on either side of the middle third, wherein the first and second lead sets are disposed in one of the outer thirds of the length, respectively.

23. An integrated circuit (IC) chip package comprising:
a lead frame configured to receive at least one semiconductor die and including a plurality of leads, wherein the plurality of leads includes a first lead set and a second lead set for the first and second semiconductor dies, respectively; and
a molding material configured to cover a portion of the lead frame and form a rectangular package body having a length (L), a width (W), and a height (H), wherein the rectangular package body has a longitudinal axis dividing the body along the width (W);
wherein the first and second lead sets include exposed portions on the rectangular package body; and
wherein the first lead set and the second lead set are disposed at on opposing sides of the longitudinal axis and at opposing ends of the rectangular package body,
wherein a diagonal line of minimal distance extending from any point on the first lead set to any point on the second lead set is greater than the length L for maximizing the creepage distance of the IC package.

24. The IC chip package of claim 23, wherein the width (W) comprises four equal-width quarters including two middle quarters and two outer quarters on either side of the two middle quarters, wherein the first and second lead sets are disposed in one of the outer quarters, respectively.

25. The IC chip package of claim 23, wherein each of the first and second lead sets includes a lead protruding from the rectangular body along one side and one end of the rectangular package body.

26. The IC chip package of claim 23, wherein the first and second lead sets are disposed at distal regions on opposite sides of the longitudinal axis, respectively.

27. The IC chip package of claim 23, further comprising first and second coils disposed in the rectangular package body and configured as a transformer.

28. The IC chip package of claim 27, wherein the at least one semiconductor die comprises first and second semiconductor dies, and wherein the first and second coils are connected to the first and second semiconductor dies, respectively.

29. The IC chip package of claim 27, wherein the transformer further comprises a transformer core.

30. An integrated circuit (IC) chip package comprising:
a lead frame configured to receive at least one semiconductor die and including a plurality of leads, wherein the plurality of leads includes a first lead set and a second lead set for the first and second semiconductor dies, respectively; and
a molding material configured to cover a portion of the lead frame and form a rectangular package body having a length (L), a width (W), and a height (H), wherein the rectangular package body has a longitudinal axis dividing the body along the width (W);
wherein the first and second lead sets include exposed portions on the rectangular package body;
wherein the first lead set and the second lead set are disposed at on opposing sides of the longitudinal axis and at opposing ends of the rectangular package body, and
wherein the width (W) comprises three equal-width thirds including a middle third and two outer thirds on either side of the middle third, wherein the first and second lead sets are disposed in one of the outer thirds, respectively.

31. A method of making a high-voltage integrated circuit (IC) package, the method comprising:
providing a substrate configured to receive at least one semiconductor die and including a plurality of leads, wherein the plurality of leads includes a first lead set and a second lead set for connection to the at least one semiconductor die;
molding a molding material to form a package body covering a portion of the substrate, wherein the package body has a length (L), a width (W), and a height (H), and wherein the package body has a longitudinal axis dividing the body along the width (W); and
configuring the first lead set and second lead set on opposing sides of the longitudinal axis and at opposing ends of the package body,
wherein a diagonal line of minimal distance extending from any point on the first lead set to any point on the second lead set is greater than the length L for maximizing the creepage distance of the IC package.

32. The method of claim 31, further comprising providing first and second coils in the package body and configured as a transformer.

33. The method of claim 32, wherein at least one semiconductor die comprises first and second semiconductor dies, and wherein the first and second coils are connected to the first and second semiconductor dies, respectively.

34. The method of claim 33, wherein the first and second semiconductor dies comprise first and second integrated circuits, and wherein the first and second integrated circuits are galvanically isolated.

35. The method of claim 33, wherein the first and/or second integrated circuit comprises a gate driver.

36. The method of claim 31, wherein the width (W) comprises three equal-width thirds including a middle third and two outer thirds on either side of the middle third, wherein the first and second lead sets are disposed in one of the outer thirds, respectively.

37. The method of claim 31, wherein the width (W) comprises four equal-width quarters including two middle quarters and two outer quarters on either side of the two middle quarters, wherein the first and second lead sets are disposed in one of the outer quarters, respectively.

38. The method of claim 31, wherein the gate first and second lead set are disposed at distal regions on opposite sides of the longitudinal axis, respectively.

39. The method of claim 31, wherein the first and second lead sets are disposed at lead locations at opposite ends of a diagonal of the package body, respectively.

40. The method of claim 31, wherein the first and second lead sets include portions that extend from the package body.

* * * * *